(12) United States Patent
Kim et al.

(10) Patent No.: US 9,099,300 B2
(45) Date of Patent: Aug. 4, 2015

(54) INSULATOR, CAPACITOR WITH THE SAME AND FABRICATION METHOD THEREOF, AND METHOD FOR FABRICATING SEMICONDUCTOR DEVICE

(75) Inventors: Kwan-Soo Kim, Cheongju-si (KR); Soon-Wook Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 724 days.

(21) Appl. No.: 12/502,416

(22) Filed: Jul. 14, 2009

(65) Prior Publication Data

US 2010/0091428 A1   Apr. 15, 2010

(30) Foreign Application Priority Data

Oct. 13, 2008   (KR) .............. 2008-0100228

(51) Int. Cl.
  H01G 4/06    (2006.01)
  H01G 4/20    (2006.01)
  H01L 21/02   (2006.01)
  H01L 21/314  (2006.01)
  H01L 49/02   (2006.01)
  B32B 37/02   (2006.01)
  H01G 4/33    (2006.01)

(52) U.S. Cl.
CPC ........ *H01L 21/02178* (2013.01); *H01L 21/022* (2013.01); *H01L 21/0228* (2013.01); *H01L 21/02181* (2013.01); *H01L 21/02274* (2013.01); *H01L 21/3142* (2013.01); *H01L 28/40* (2013.01); *B32B 37/02* (2013.01); *B32B 2311/00* (2013.01); *B32B 2311/24* (2013.01); *B32B 2457/00* (2013.01); *H01G 4/33* (2013.01); *Y10T 156/10* (2015.01); *Y10T 428/2495* (2015.01); *Y10T 428/26* (2015.01)

(58) Field of Classification Search
USPC .......................................... 361/311, 312, 313
See application file for complete search history.

(56) References Cited

U.S. PATENT DOCUMENTS

2004/0043557 A1*  3/2004  Haukka et al. ................ 438/240
2004/0245602 A1* 12/2004  Kim et al. ..................... 257/532
2005/0156221 A1*  7/2005  Kiyotoshi ..................... 257/306

(Continued)

FOREIGN PATENT DOCUMENTS

KR   10 2006 0003172 A   1/2006
KR   10 2007 0045722 A   5/2007

OTHER PUBLICATIONS

M.H. Cho, Y.S. Roh, C.N. Whang, K.Jeong,"Dielectric characteristics of Al2O3-HfO2 nanolaminates on Si(100)", Aug. 5, 2002, American Institute of Physics, vol. 81 No. 6, pp. 1071-1073.*

(Continued)

*Primary Examiner* — Eric Thomas
*Assistant Examiner* — Arun Ramaswamy
(74) *Attorney, Agent, or Firm* — NSIP Law

(57) ABSTRACT

Disclosed is a multilayer insulator, a metal-insulator-metal (MIM) capacitor with the same, and a fabricating method thereof. The capacitor includes: a first electrode; an insulator disposed on the first electrode, the insulator including: a laminate structure in which an aluminum oxide ($Al_2O_3$) layer and a hafnium oxide ($HfO_2$) layer are laminated alternately in an iterative manner and a bottom layer and a top layer are formed of the same material; and a second electrode disposed on the insulator.

32 Claims, 10 Drawing Sheets

(56) References Cited

U.S. PATENT DOCUMENTS

2007/0102742 A1* 5/2007 Kil et al. ........................ 257/295
2008/0160712 A1* 7/2008 Park .............................. 438/381

OTHER PUBLICATIONS

Pan Kwi Park, Eun-Soo Cha, and Sang-Won Kang, "Interface efect on dielectric constant of HfO2/Al2O3 nanolaminate films deposited by plasma-enhanced atomic layer deposition", Jun. 5, 2007, American Institute of Physics, vol. 90, pp. 232906-1 to 223906-3.*

Hu et al., "High Performance ALD $HfO_2$—$Al_2O_3$ Laminate MIM Capacitors for RF and Mixed Signal IC Applications," *IEDM Tech. Dig.*, 2003, pp. 379-382.

Lin et al., "Microstructural Evolution of Metal-Insulator-Metal Capacitor Prepared by Atomic-Layer-Deposition System at Elevated Temperature," *Japanese Journal of Applied Physics*, vol. 45, No. 4B, 2006, pp. 3036-3039.

Korean Office Action issued on Sep. 29, 2010, in corresponding Korean Patent Application No. 10-2008-0100228 (7 pages).

* cited by examiner

INSULATOR, CAPACITOR WITH THE SAME AND FABRICATION METHOD THEREOF, AND METHOD FOR FABRICATING SEMICONDUCTOR DEVICE

CROSS-REFERENCE TO RELATED APPLICATIONS

The present invention claims priority of Korean Patent Application No. 10-2008-0100228, filed with Korean Intellectual Property Office on Oct. 13, 2008, which is incorporated herein by reference.

BACKGROUND OF THE INVENTION

1. Field of the Invention

The present invention relates to semiconductor fabrication technology; and, more particularly, to a multilayer insulator, a metal-insulator-metal (MIM) capacitor with the same, and a fabricating method thereof.

2. Description of Related Art

A capacitor with a MIM structure (hereinafter referred to as an MIM capacitor) is widely used in analog and radio frequency (RF) circuits. Recently, a demand for a high electrostatic capacitance has increased rapidly for the fabrication cost reduction and the high integration of a semiconductor device. Also, it is essential to develop a capacitor with good leakage current characteristics for use in a high-sensitive application device. The electrostatic capacitance is increased by decreasing the thickness of an insulator or by using a material with a high dielectric constant. These methods, however, may degrade the leakage current characteristics. Accordingly, such characteristics may become important requirements for use of the MIM capacitor.

SUMMARY OF THE INVENTION

An embodiment of the present invention is directed to an insulator that can achieve high electrostatic capacitance and good leakage current characteristics.

Another embodiment of the present invention is directed to a capacitor with high electrostatic capacitance.

Another embodiment of the present invention is directed to a capacitor that has good leakage current and breakdown voltage characteristics to be advantageous to a high-voltage device.

Another embodiment of the present invention is directed to a method for fabricating a capacitor that has high electrostatic capacitance and good leakage current and breakdown voltage characteristics to be advantageous to a high-voltage device.

Another embodiment of the present invention is directed to a method for fabricating a semiconductor device with a capacitor that has high electrostatic capacitance and good leakage current and breakdown voltage characteristics to be advantageous to a high-voltage device.

In accordance with an aspect of the present invention, there is provided an insulator comprising a laminate structure in which an aluminum oxide ($Al_2O_3$) layer and a hafnium oxide ($HfO_2$) layer are laminated alternately in an iterative manner and a bottom layer and a top layer are formed of the same material.

In accordance with another aspect of the present invention, there is provided a capacitor including: a first electrode; an insulator disposed on the first electrode, the insulator including: a laminate structure in which an aluminum oxide ($Al_2O_3$) layer and a hafnium oxide ($HfO_2$) layer are laminated alternately in an iterative manner and a bottom layer and a top layer are formed of the same material; and a second electrode disposed on the insulator.

In accordance with another aspect of the present invention, there is provided a method for fabricating a capacitor, the method including: forming a first electrode; forming an insulator having a laminate structure in which an aluminum oxide ($Al_2O_3$) layer and a hafnium oxide ($HfO_2$) layer are laminated on the first electrode alternately in an iterative manner and a bottom layer and a top layer are formed of the same material; and forming a second electrode on the insulator.

In accordance with another aspect of the present invention, there is provided a method for fabricating a semiconductor device, including: forming a first insulating layer on a substrate; forming a lower interconnection on the first insulating layer; forming a first electrode on the lower interconnection; forming an insulator having a laminate structure in which an aluminum oxide ($Al_2O_3$) layer and a hafnium oxide ($HfO_2$) layer are laminated on the first electrode alternately in an iterative manner; forming a conductive layer on the insulator; etching the conductive layer to form a second electrode; etching the insulator such that the insulator is left to a predetermined thickness on the first electrode; forming a second insulating layer on the substrate including the second electrode and the insulator; forming a via connected to each of the first and second electrodes in the second insulating layer; and forming an upper interconnection connected to the via on the second insulating layer.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
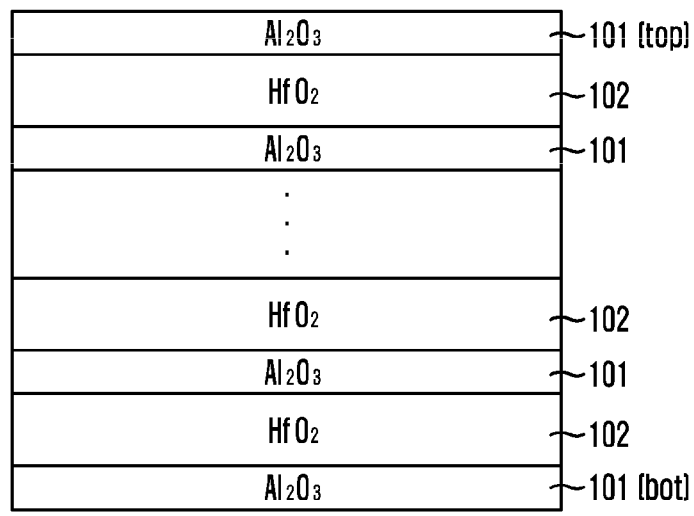
FIG. 1 is a cross-sectional view of an insulator in accordance with an exemplary embodiment of the present invention.

The advantages, features and aspects of the invention will become apparent from the following description of the embodiments with reference to the accompanying drawings, which is set forth hereinafter.

In the drawings, the dimensions of layers and regions are exaggerated for clarity of illustration. Like reference numerals in the drawings denote like elements, and thus their description will be omitted. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

EMBODIMENTS

Figure 2:
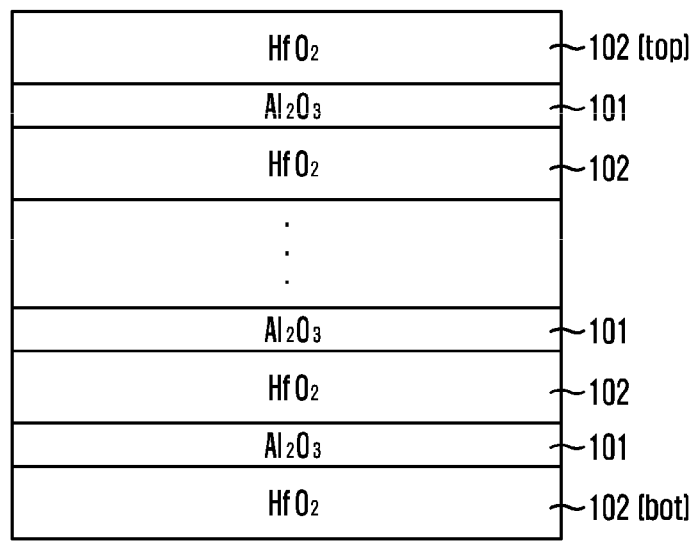
FIG. 2 is a cross-sectional view of an insulator in accordance with another exemplary embodiment of the present invention.

FIGS. 1 and 2 are cross-sectional views of insulators in accordance with exemplary embodiments of the present invention.

Referring to FIGS. 1 and 2, an insulator in accordance with an exemplary embodiment of the present invention has a laminate structure where an aluminum oxide ($Al_2O_3$) layer 101 and a hafnium oxide ($HfO_2$) layer 102 are laminated alternately in an iterative manner and a bottom layer BOT and a top layer TOP are formed of the same material. That is, the insulator has not a sandwich structure but a laminate structure where an aluminum oxide ($Al_2O_3$) layer 101 and a hafnium oxide ($HfO_2$) layer 102, which are high-dielectric layers having a larger band gap than a silicon oxide ($SiO_2$) layer or a tantalum oxide ($Ta_2O_3$) layer, are laminated alternately in an iterative manner.

As described above, the bottom layer BOT and the top layer TOP of the insulator in accordance with an exemplary embodiment of the present invention are formed of the same material in order to achieve uniform characteristics (including linearity). For example, the insulator may have a laminate structure where the bottom layer BOT and the top layer TOP are formed of aluminum oxide ($Al_2O_3$) as illustrated in FIG. 1. Also, the insulator may have a laminate structure where the bottom layer BOT and the top layer TOP are formed of hafnium oxide ($HfO_2$) as illustrated in FIG. 2.

In the insulator structure in accordance with an exemplary embodiment of the present invention, an aluminum oxide ($Al_2O_3$) layer and a hafnium oxide ($HfO_2$) layer are laminated to form a layer pair AH or HA (herein, 'A' denotes an aluminum oxide ($Al_2O_3$) layer and 'H' denotes a hafnium oxide ($HfO_2$) layer), and the layer pair is iteratively laminated two or more times, preferably 2 to 1500 times, more preferably 9 times. For example, if the layer pair is iteratively laminated 9 times, the resulting laminate structure becomes '9AH+A (AHAHAHAHAHAHAHAHA)'.

In the laminate structure of the insulator in accordance with an exemplary embodiment of the present invention, the total thickness of the aluminum oxide ($Al_2O_3$) layers 101 is smaller than the total thickness of the hafnium oxide ($HfO_2$) layers 102. Preferably, the ratio of the total thickness of the aluminum oxide ($Al_2O_3$) layers 101 with respect to the total thickens of the total thickness of the insulator is approximately 10% to approximately 30%.

The total thickness of the laminate structure of the insulator in accordance with an exemplary embodiment of the present invention is approximately 20 Å to approximately 300 Å In the laminate structure, the aluminum oxide ($Al_2O_3$) layers 101 are equal or different in thickness. Also, in the laminate structure, the hafnium oxide ($HfO_2$) layers 102 are equal or different in thickness.

In the laminate structure of the insulator in accordance with an exemplary embodiment of the present invention, the bottom layer BOT and the top layer TOP are thicker than other layers interposed between the bottom layer BOT and the top layer TOP. Alternatively, the bottom layer BOT and the top layer TOP may be thinner than other layers interposed between the bottom layer BOT and the top layer TOP.

In the insulator in accordance with an exemplary embodiment of the present invention, the aluminum oxide ($Al_2O_3$) layer 101 is formed to a thickness of approximately 5 Å to approximately 10 Å. A hafnium oxide ($HfO_2$) layer is crystallized when it is formed to a thickness of more than approximately 40 Å. Therefore, the hafnium oxide ($HfO_2$) 102 layer is formed to a thickness of approximately 10 Å to approximately 40 Å.

In the insulator in accordance with an exemplary embodiment of the present invention, the aluminum oxide ($Al_2O_3$) layer 101 and the hafnium oxide ($HfO_2$) layer 102 may be doped with one of lanthanide elements in order to improve the breakdown voltage characteristics of the insulator. Examples of the lanthanide elements include lanthanum (La), yttrium (Y), iridium (Ir), rhodium (Ro), osmium (Os), palladium (Pd), and ruthenium (Ru).

In the insulator in accordance with an exemplary embodiment of the present invention, the aluminum oxide ($Al_2O_3$) layer 101 and the hafnium oxide ($HfO_2$) layer 102 may be deposited using a plasma enhanced atomic layer deposition (PEALD) process or a thermal ALD process. Alternatively, the aluminum oxide ($Al_2O_3$) layer 101 and the hafnium oxide ($HfO_2$) layer 102 may be deposited using a PEALD process and a thermal ALD process together.

When the deposition process is changed, reaction gas and process conditions change to change the layer material and characteristics, so that an interface between both sides (top and rear) of the insulator can be controlled to a similar state. Herein, the thermal ALD process may be inferior to the PEALD process in terms of throughput because the thermal ALD process provides a lower deposition rate than the PEALD process. Thus, the linearity can be improved without much influence on the throughput, when only some of the aluminum oxide ($Al_2O_3$) layers of the insulator are deposited using the thermal ALD process.

Figure 3:
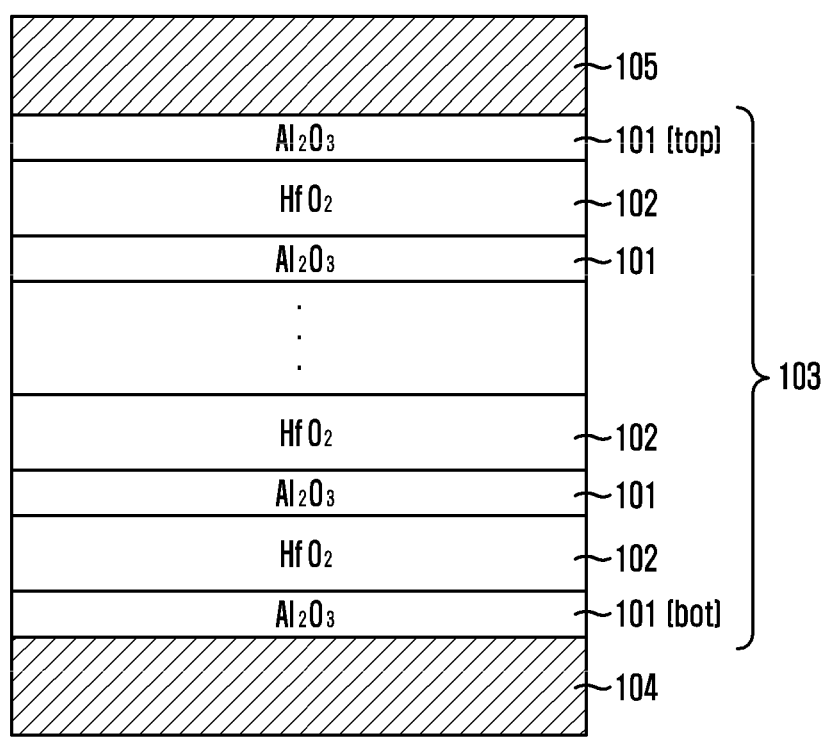
FIG. 3 is a cross-sectional view of a capacitor including the insulator illustrated in FIG. 1.

FIG. 3 is a cross-sectional view of a metal-insulator-metal (MIM) capacitor including the insulator illustrated in FIG. 1.

Referring to FIG. 3, an MIM capacitor in accordance with the present invention includes a first electrode 104, an insulator 103 disposed on the first electrode 104, and a second electrode 105 disposed on the insulator 103.

In a laminate structure of the insulator 103, an aluminum oxide ($Al_2O_3$) layer 101 superior in terms of leakage current prevents a sudden leakage current from being generated at both sides of a hafnium oxide ($HfO_2$) layer 102 due to a breakdown voltage of the hafnium oxide ($HfO_2$) layer 102. Also, the aluminum oxide ($Al_2O_3$) layer 101 and the hafnium oxide ($HfO_2$) layer 102 are laminated not in a sandwich structure but in a laminate structure in order to achieve a breakdown voltage and a leakage current to the extent required in a high-voltage device.

The first and second electrodes 104 and 105 may be arranged in the vertical direction or the horizontal direction with respect to each other. The first and second electrodes 104 and 105 include one of a metal layer, a metal nitride layer, and a laminate layer thereof. The metal layer may be one of transition metal layers, and the metal nitride layer may be one of transition metal nitride layers. The transition metal may be titanium (Ti), tantalum (Ta), or tungsten (W) The metal nitride layer may be a titanium nitride (TiN) layer, a tantalum nitride (TaN) layer, or a tungsten nitride (WN) layer. Also, the first and second electrodes 104 and 105 may be formed of the same material or may be formed of different materials. Preferably, the first and second electrodes 104 and 105 are formed of the same material in order to achieve the uniform characteristics.

FIGS. 4A to 4D are cross-sectional views illustrating a method for fabricating the MIM capacitor illustrated in FIG. 3.

Figure 4A:
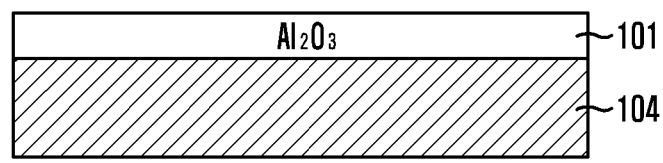
FIGS. 4A to 4D are cross-sectional views illustrating a method for fabricating the capacitor illustrated in FIG. 3.

Referring to FIG. 4A, a first electrode 104 is formed. The first electrode 104 may be formed using a physical vapor deposition (PVD) process or a chemical vapor deposition (CVD) process. If the first electrode 104 is formed using the PVD process, a columnar growth occurs to cause an uneven surface of the deposited layer. Therefore, it is preferable that the first electrode 104 is formed using the CVD process.

Figure 6:
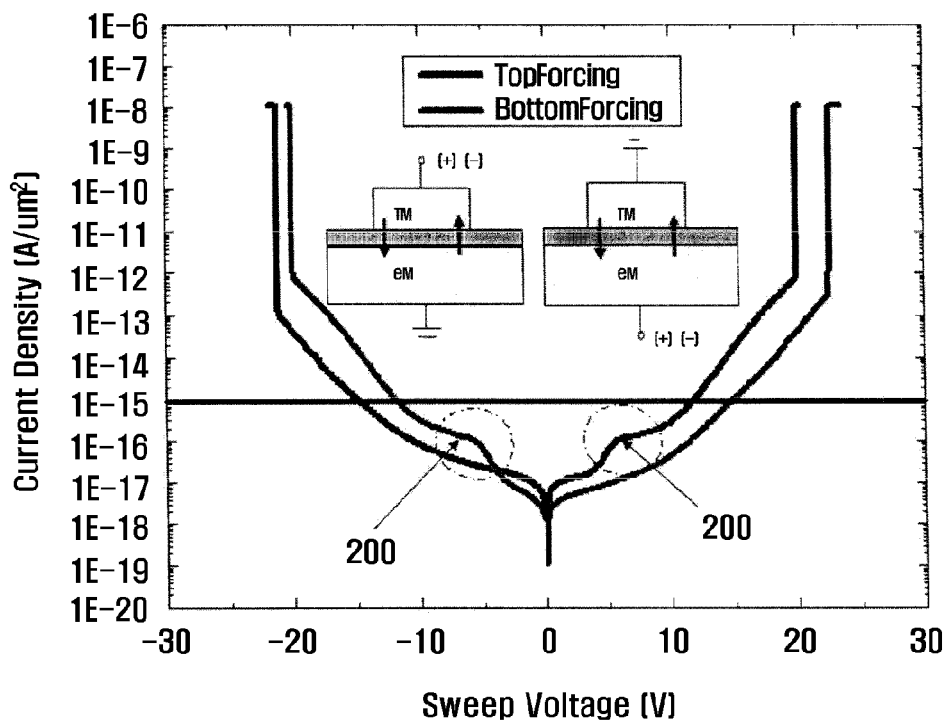
FIG. 6 is a graph illustrating the current-voltage (I-V) characteristics of an MIM capacitor.

As illustrated in FIG. 6, if the first and second electrodes 104 and 105 are poor in terms of surface roughness, the current-voltage (I-V) characteristics of the MIM capacitor vary depending on the voltage application directions. Accordingly, the current-voltage (I-V) characteristics degrade when electrons move from the first electrode 104 to the second electrode 105. That is, like a portion 200 illustrated in FIG. 6, a leakage current suddenly increases at a low voltage.

An aluminum oxide ($Al_2O_3$) layer 101 is formed on the first electrode 104. The aluminum oxide ($Al_2O_3$) layer 101 is deposited using a plasma enhanced atomic layer deposition (PEALD) process or a thermal ALD process.

For example, the thermal ALD process is performed within 5 to 10 cycles wherein one cycle includes a source supply step, a purge step, a reaction gas supply step, and a purge step. The thermal ALD process is performed using one selected from the group consisting of $Al(CH_3)_3$, $Al(C_2H_5)_3$, and an Al-containing compound as an aluminum source gas. The thermal ALD process is performed using water vapor ($H_2O$) as a reaction gas. The thermal ALD process is performed at temperatures of approximately 250° C. to approximately 350° C. under pressures of approximately 1.5 torr to approximately 6.0 torr. Also, the PEALD process is performed using an aluminum source gas selected from the group consisting of $Al(CH_3)_3$, $Al(C_2H_5)_3$, and an Al-containing compound. The PEALD process is performed using one of oxygen ($O_2$), water vapor ($H_2O$), nitric oxide ($N_2O$), and ozone ($O_3$) as a reaction gas. The PEALD process is performed at temperatures of approximately 250° C. to approximately 350° C. under pressures of approximately 2.5 torr to approximately 5.0 torr. The PEALD process is performed using a radio frequency (RF) power of approximately 300 W to approximately 700 W as a source power.

Figure 4B:
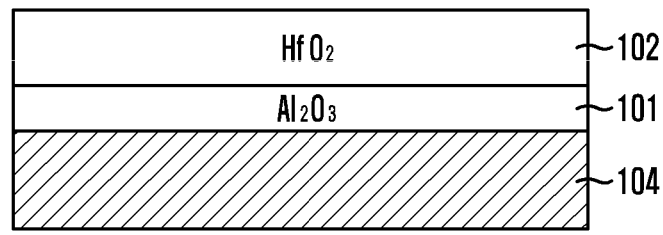

Referring to FIG. 4B, a hafnium oxide ($HfO_2$) layer 102 is formed on the aluminum oxide ($Al_2O_3$) layer 101. The hafnium oxide ($HfO_2$) layer 102 is formed using a PEALD process. For example, the PEALD process is performed using $C_{16}H_{36}HfO_4$, TEMA-Hf (Tetrakis ethylmethyamino Hafnium), or $Hf[N(CH_3)(C_2H_5)_4]$ as a hafnium source gas. The PEALD process is performed using one of oxygen ($O_2$), water vapor ($H_2O$), nitric oxide ($N_2O$), and ozone ($O_3$) as a reaction gas. The PEALD process is performed at temperatures of approximately 250° C. to approximately 350° C. under pressures of approximately 2.5 torr to approximately 5.0 torr.

Figure 4C:
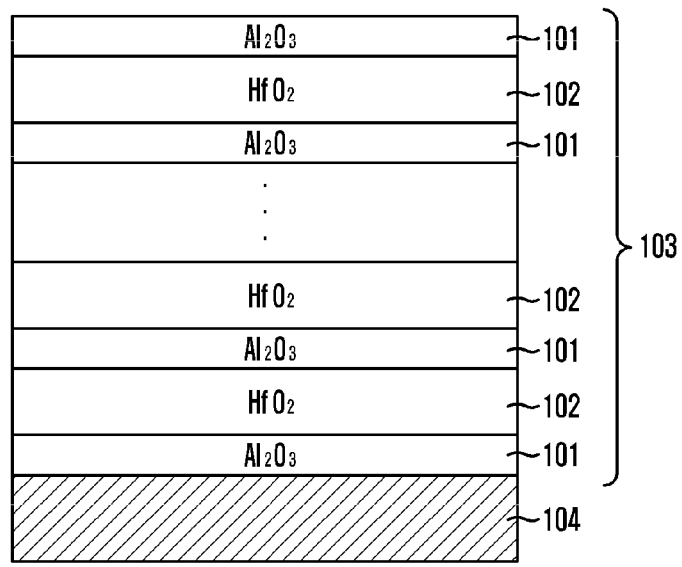

Referring to FIG. 4C, the processes of FIGS. 4A and 4B are repeated to alternate an aluminum oxide ($Al_2O_3$) layer 101 and a hafnium oxide ($HfO_2$) layer 102 in a laminate structure, thereby forming a laminate insulator 103. It is preferable that the insulator 103 is formed by an in-situ process in the same chamber using the same deposition equipment.

Figure 4D:
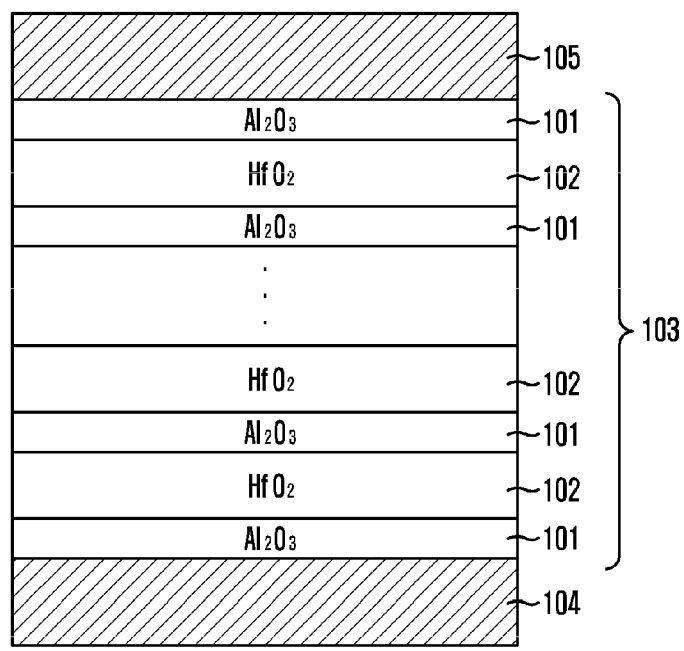

Referring to FIG. 4D, a second electrode 105 is formed on the insulator 103. The second electrode 105 may be formed using the same material and the same way as the first electrode 104.

FIGS. 5A to 5E are cross-sectional views illustrating a method for fabricating a semiconductor device including the capacitor illustrated in FIG. 3.

Figure 5A:
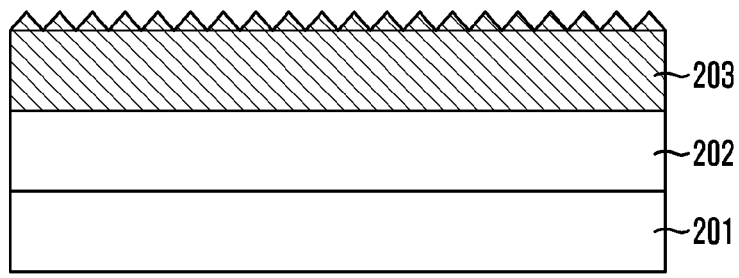
FIGS. 5A to 5E are cross-sectional views illustrating a method for fabricating a semiconductor device including the capacitor illustrated in FIG. 3.

Referring to FIG. 5A, a first insulating layer 202 is formed on a substrate 201 having a structure formed through a series of fabrication processes. The first insulating layer 202 is formed to include an oxide layer. For example, the first insulating layer 202 may be formed to include one of a BPSG (BoroPhosphoSilicate Glass) layer, a PSG (PhosphoSilicate Glass) layer, a BSG (BoroSilicate Glass) layer, a USG (Undoped Silicate Glass) layer, a TEOS (Tetra Ethyle Ortho Silicate) layer, an HDP (High Density Plasma) layer, and a laminate layer of two or more of them. Also, the first insulating layer 202 may be formed to include a layer coated by a spin coating process, such as an SOD (Spin On Dielectric) layer.

A conductive layer 203 for a lower interconnection is formed on the first insulating layer 202. For example, the conductive layer 203 is formed using one of transition metals. Preferably, the conductive layer 203 is formed using aluminum (Al).

Figure 5B:
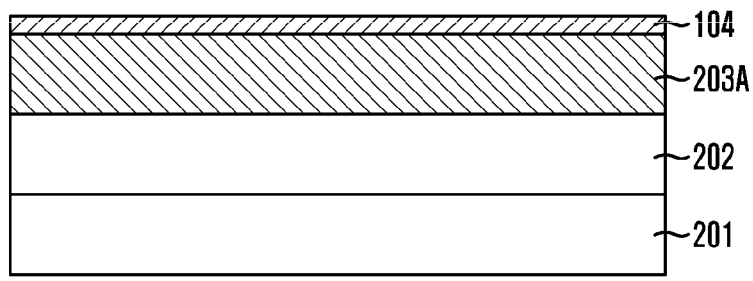

Referring to FIG. 5B, the conductive layer 203 is polished to form a lower interconnection 203A. If the conductive layer 203 is formed using aluminum, the roughness of the aluminum surface may affect the leakage current characteristics of the capacitor. Therefore, the conductive layer 203 is deposited to a thickness greater than a target thickness, and a polishing process such as a chemical mechanical polishing (CMP) process is performed to polish the surface of the lower interconnection 203A to be smooth.

A first electrode 104 is formed on the lower interconnection 203A. It is preferable that the first electrode 104 is formed using a CVD process so that it has the same evenness as the top surface of the lower interconnection 203A. For example, the first electrode 104 is formed of a titanium nitride material.

Figure 5C:
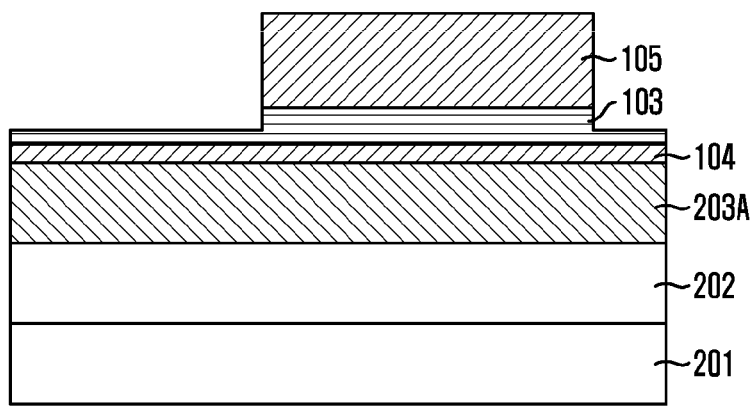

Referring to FIG. 5C, an insulator 103 and a second electrode 105 are sequentially formed on the first electrode 104 in the same way as illustrated in FIGS. 4A and 4D.

The second electrode 105 and the insulator are etched. Herein, the insulator 103 is etched, not such that the first electrode 104 is exposed, but such that the insulator 103 is left to a predetermined thickness on the first electrode 104. The left thickness of the insulator 103 is approximately ¼ to approximately ¾ of the total thickness of the insulator 103. Preferably, the left thickness of the insulator 103 is approximately ¼ of the total thickness of the insulator 103. The left insulator 103 serves to protect the first electrode 104. If the insulator 103 is all etched, a portion of the first electrode 104 is also etched to create a metallic polymer as an etch by-product. This metallic polymer causes an electrical short between the first and second electrodes 104 and 105, thus leading to a high leakage current.

Figure 5D:
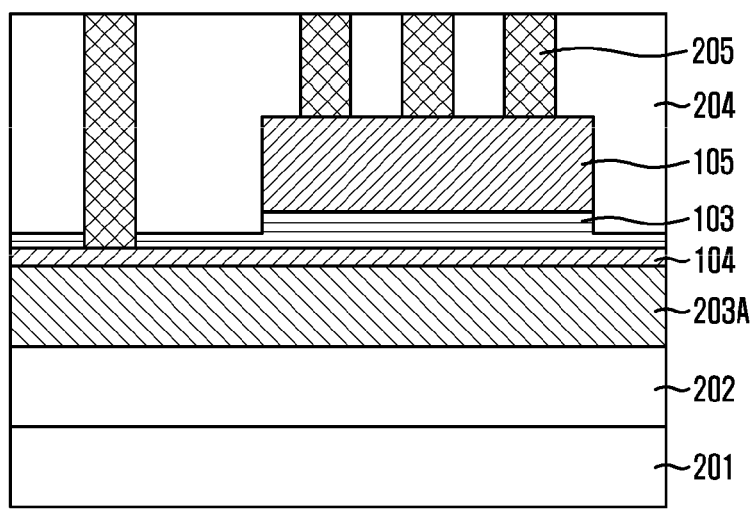

Referring to FIG. 5D, a second insulating layer 204 is formed on the substrate 201 to cover the second electrode 105 and the insulator 103. The second insulating layer 204 is formed of an oxide material.

A via 205 is formed to contact each of the first electrode 104 and the second electrode 105. The second insulating layer 204 is etched and the via 205 is formed in the inside of the second insulating layer 204. The via 205 serves a contact plug that connects each of the first and second electrodes 104 and 105 to an upper interconnection. The via 205 may be formed of one of transition metals.

Figure 5E:
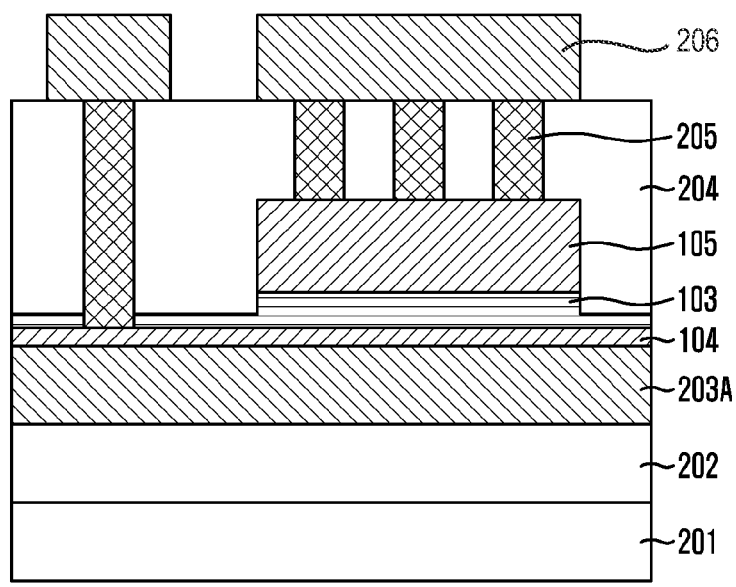

Referring to FIG. 5E, an upper interconnection 206 is formed on the second insulating layer 204 such that the upper interconnection 206 is connected to the via 205. The upper interconnection 206 may be formed of one of transition metals. Preferably, the upper interconnection 206 is formed of aluminum (Al), cuprum (Cu), or platinum (Pt).

Hereinafter, a description will be given of the characteristics of an insulator in accordance with an exemplary embodiment of the present invention.

Experiment Example 1

After an electrostatic capacitance density was targeted on a high capacitance (4 fF/$\mu m^2$, 100 KHz), an experiment was performed setting an insulator structure for a high voltage as Table 1 below.

TABLE 1

| Structure | Detailed Structure | Split | $Al_2O_3$ Portion (%) |
|---|---|---|---|
| Sandwich | AHA | 1 | 12 |
|  | ($Al_2O_3$/$HfO_2$/$Al_2O_3$) | 2 | 26 |
|  |  | 3 | 44 |
|  | HAH | 4 | 22 |
|  | ($HfO_2$/$Al_2O_3$/$HfO_2$) | 5 | 36 |
|  |  | 6 | 52 |
| laminate | 3AH + A | 7 | 26 |
|  | 5AH + A | 8 | 26 |
|  | 7AH + A | 9 | 37 |
|  | 9AH + A | 10 | 37 |

Figure 7:
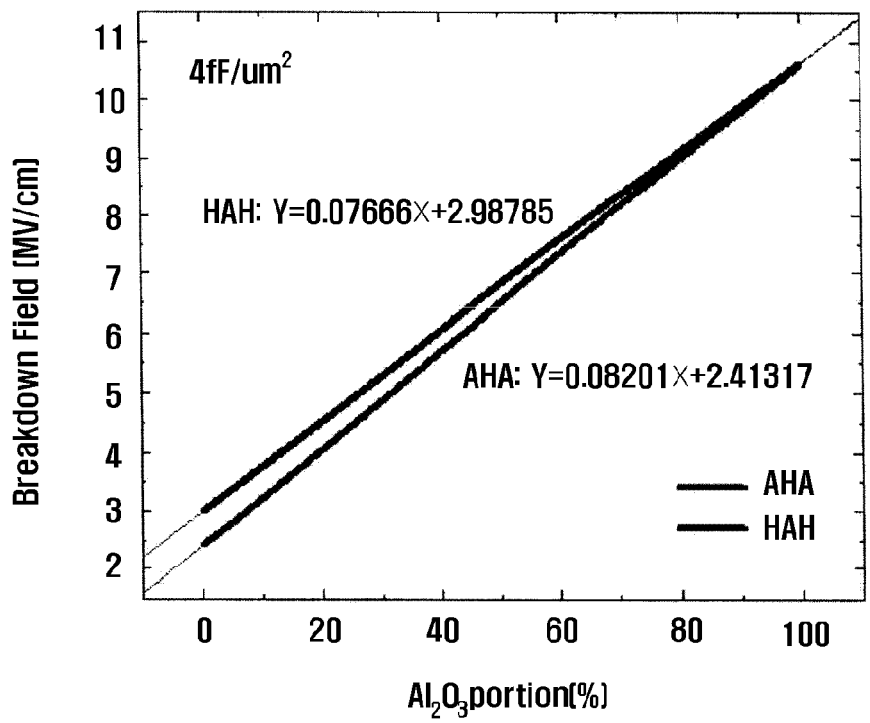
FIG. 7 is a graph illustrating a breakdown field according to the thickness ratio of an aluminum oxide ($Al_2O_3$) layer.

FIG. 7 is a graph illustrating a breakdown field (MV/cm) according to the thickness ratio of an aluminum oxide ($Al_2O_3$) layer with respect to the total thickness of a sandwich insulator structure.

As can be seen from FIG. 7, a breakdown field linearly increases with the thickness ratio of an aluminum oxide ($Al_2O_3$) layer. This result shows that the breakdown field is caused by the thickness ratio of the aluminum oxide ($Al_2O_3$) layer in the total thickness of the insulator, regardless of the structures of AHA and HAH.

However, when the thickness ratio of the aluminum oxide ($Al_2O_3$) layer increases, the thickness ratio of the hafnium oxide ($HfO_2$) layer decreases relatively. Therefore, when the thickness ratio of the aluminum oxide ($Al_2O_3$) layer increases, the total thickness of the hafnium oxide ($HfO_2$) layer decreases, thus decreasing the breakdown voltage.

Figure 8:
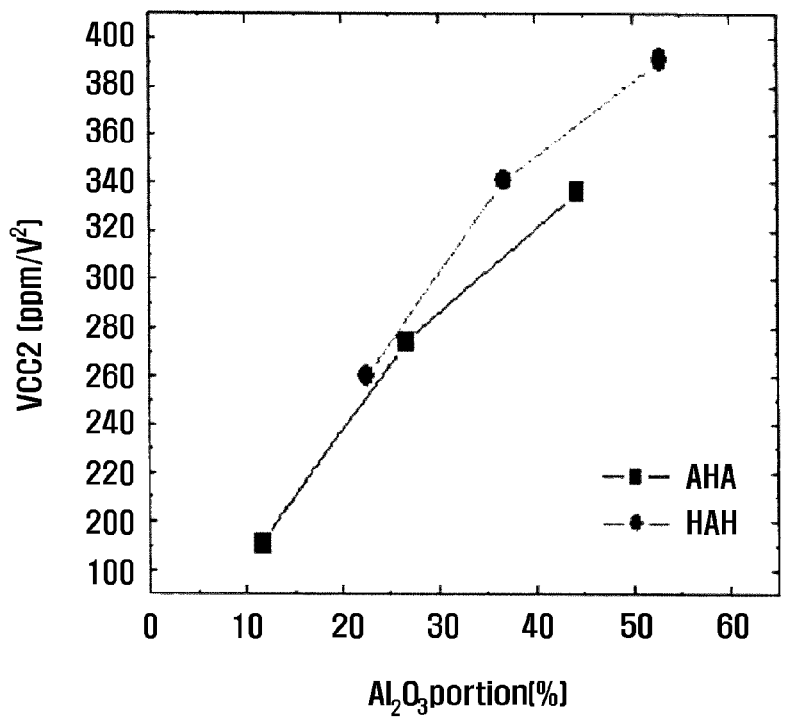
FIG. 8 is a graph illustrating a VCC2 value according to the thickness ratio of an aluminum oxide ($Al_2O_3$) layer.

FIG. 8 is a graph illustrating a VCC2 (Voltage Coefficient of Capacitance) value according to the thickness ratio of an aluminum oxide ($Al_2O_3$) layer.

As illustrated in FIG. 8, when the thickness ratio of an aluminum oxide ($Al_2O_3$) layer increases, a VCC2 (Voltage Coefficient of Capacitance) value increases. Therefore, it is impossible to increase the thickness of the aluminum oxide ($Al_2O_3$) layer without limit.

When considering the VCC2 value, it is preferable that the thickness ratio of the aluminum oxide ($Al_2O_3$) layer is approximately 10% to approximately 30%. Also, the AHA structure is advantageous over the HAH structure. However, as described above, when the thickness ratio of the aluminum oxide ($Al_2O_3$) layer decreases, a breakdown field decreases accordingly. Thus, it is preferable that the insulator structure of the capacitor changes into a laminate structure instead of a sandwich structure in order to compensate the decreased breakdown field.

Figure 9:
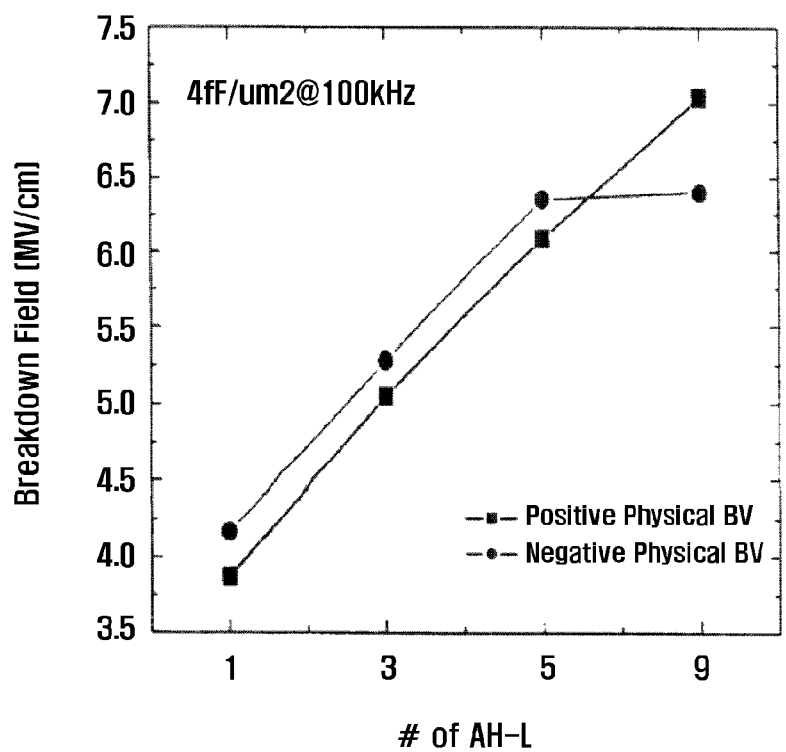
FIG. 9 is a graph illustrating the breakdown field characteristics with respect to the number of alternate laminations of an aluminum oxide ($Al_2O_3$) layer and a hafnium oxide ($HfO_2$) layer in a laminate structure.

FIG. 9 is a graph illustrating the breakdown field characteristics with respect to the number of alternate laminations of an aluminum oxide ($Al_2O_3$) layer and a hafnium oxide ($HfO_2$) layer in a laminate structure.

As can be seen from FIG. 9, a breakdown field increases with an increase in the number of alternate laminations of an aluminum oxide ($Al_2O_3$) layer and a hafnium oxide ($HfO_2$) layer in a laminate structure. That is, when an insulator structure is laminated not in a sandwich structure but in a laminate structure in an iterative manner, the breakdown field can be increased while improving the VCC2 characteristics.

Figure 10:
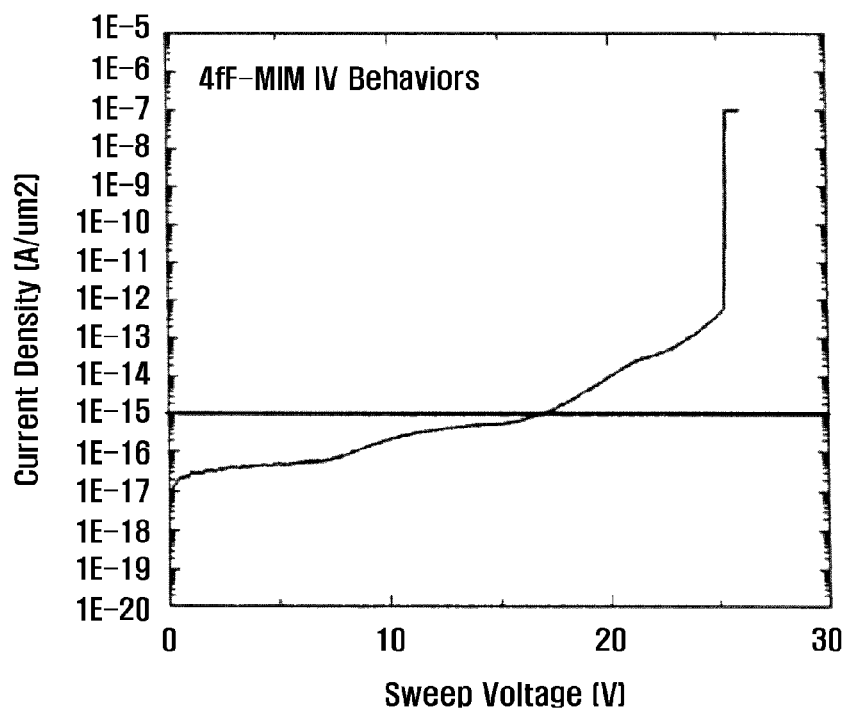
FIG. 10 is a graph illustrating the I-V characteristics of a capacitor including an insulator in accordance with an exemplary embodiment of the present invention.

FIG. 10 is a graph illustrating the I-V characteristics of the capacitor including the insulator in accordance with an exemplary embodiment of the present invention.

As illustrated FIG. 10, the I-V behavior of the capacitor shows that a leakage current density can be controlled below approximately 1 fA/$\mu m^2$ until approximately 16.7 V. Thus, a capacitor for a high capacitance (4 fF/$\mu m^2$) and a high voltage (15V, 1 fA/$\mu m^2$) can be fabricated and the present invention can be applied to a high-voltage device.

Experiment Example 2

In implementing a capacitor, the electrostatic capacitance is determined by the dielectric constant and the thickness of an insulator and the I-V characteristics are determined by the material and the thickness of the insulator. This, however, is possible only when other processes are implemented stably in the capacitor fabrication process. In implementing the capacitor, the important process is a process of etching a second electrode 105 (i.e., a top electrode) as illustrated in FIG. 5C.

Figure 11:
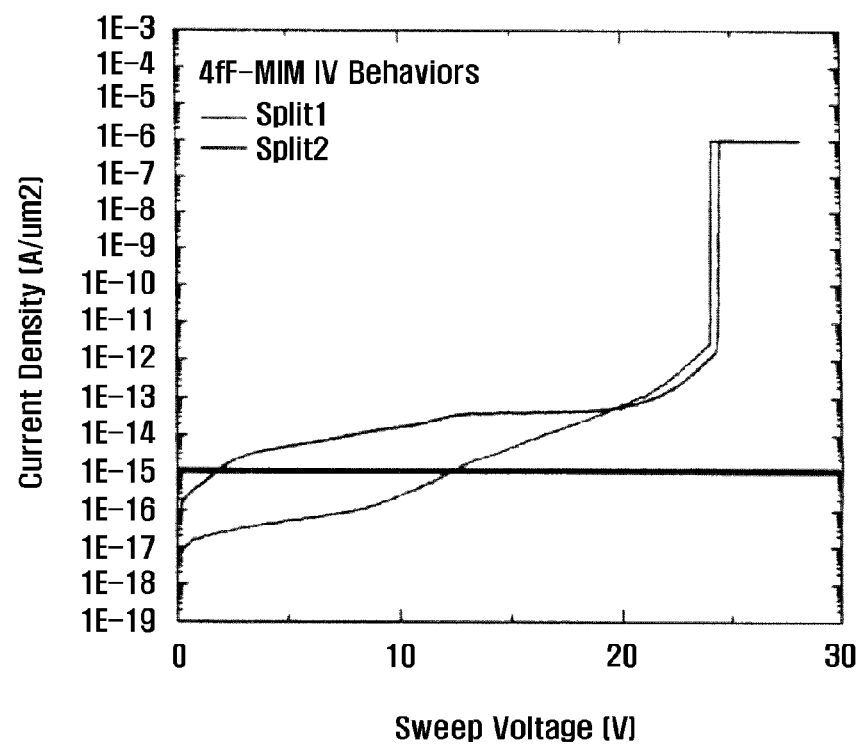
FIG. 11 is a graph illustrating the I-V characteristics of a capacitor that is fabricated by leaving an insulator on a bottom electrode (split1) or removing all the insulator (split2).

FIG. 11 is a graph illustrating the I-V characteristics of a capacitor that is fabricated by leaving an insulator on a first electrode 104 (i.e., a bottom electrode) (split1) or removing all of the insulator (split2) when etching a second electrode 105.

As can be seen from FIG. 11, a leakage current is high in the split 2 than in the split 1. This is because a metallic polymer, which was formed when a portion of the first electrode 104 was etched, adheres to the side of the capacitor, thus causing a leakage current. Therefore, this problem can be prevented when a portion of the insulator is left after the second electrode 105 (i.e., the top electrode) of the capacitor is etched.

As described above, the present invention provides the insulator with the laminate structure including a plurality of alternate laminations of an aluminum oxide ($Al_2O_3$) layer and a hafnium oxide ($HfO_2$) layer. Thus, the present invention can be used in various analog designs for chip size reduction. In particular, the preset invention can be usefully applied to an analog design that provides a high capacitance (4 fF/$\mu m^2$) and uses a high voltage (15V).

While the present invention has been described with respect to the specific embodiments, it will be apparent to those skilled in the art that various changes and modifications may be made without departing from the spirit and scope of the invention as defined in the following claims.

What is claimed is:

1. An insulator, comprising:
   a laminate structure in which two or more aluminum oxide ($Al_2O_3$) layers and two or more hafnium oxide ($HfO_2$) layers are laminated alternately in an iterative manner and a bottom layer and a top layer are formed of the same material, the two or more hafnium oxide ($HfO_2$) layers not crystallized, and the aluminum oxide ($Al_2O_3$) layers in the laminate structure each having the same thickness, the total thickness of the aluminum oxide ($Al_2O_3$) layers being smaller than the total thickness of the hafnium oxide ($HfO_2$) layers in the laminate structure,
   wherein an upper surface of the bottom layer has a greater surface area than an upper surface of the top layer such that a portion of the bottom layer extends outside the top layer;
   an upper surface of at least one layer of the two or more aluminum oxide ($Al_2O_3$) layers and the two or more hafnium oxide ($HfO_2$) layers has a substantially equal surface area as the upper surface of the top layer; and
   an upper surface of at least one other layer of the two or more aluminum oxide ($Al_2O_3$) layers and the two or more hafnium oxide ($HfO_2$) layers has a substantially equal surface area as the upper surface of the bottom layer, such that a portion of the laminate structure disposed on the bottom layer outside the top layer has a thickness that is less than a portion of the laminate structure covered with the top layer.

2. The insulator of claim 1, wherein the bottom layer and the top layer are formed of an aluminum oxide ($Al_2O_3$) material.

3. The insulator of claim 1, wherein the bottom layer and the top layer are formed of a hafnium oxide ($HfO_2$) material.

4. The insulator of claim 1, wherein the number of the alternate laminations of the aluminum oxide ($Al_2O_3$) layer and the hafnium oxide ($HfO_2$) layer is approximately 2 to approximately 1500.

5. The insulator of claim 1, wherein the ratio of the total thickness of the aluminum oxide ($Al_2O_3$) layer with respect to the total thickness of the laminate structure is approximately 10% to approximately 30%.

6. The insulator of claim 1, wherein the total thickness of the laminate structure is approximately 20 Å to approximately 3000 Å.

7. The insulator of claim 1, wherein the hafnium oxide ($HfO_2$) layers in the laminate structure each have the same thickness.

8. The insulator of claim 1, wherein the hafnium oxide ($HfO_2$) layers in the laminate structure are have different thicknesses.

9. The insulator of claim 1, wherein the bottom layer and the top layer are formed to be thicker than the other layers in the laminate structure.

10. The insulator of claim 1, wherein the bottom layer and the top layer are formed to be thinner than the other layers in the laminate structure.

11. The insulator of claim 1, wherein the aluminum oxide ($Al_2O_3$) layers are formed to a thickness of approximately 5 Å to approximately 10 Å.

12. The insulator of claim 1, wherein the hafnium oxide ($HfO_2$) layers are formed to a thickness of approximately 10 Å to approximately 40 Å.

13. The insulator of claim 1, wherein at least one of the aluminum oxide ($Al_2O_3$) layers and at least one of the hafnium oxide ($HfO_2$) layers are doped with one of lanthanide elements.

14. The insulator of claim 1, wherein the aluminum oxide ($Al_2O_3$) layer and the hafnium oxide ($HfO_2$) layer are deposited using a plasma enhanced atomic layer deposition (PEALD) process or a thermal ALD process.

15. A capacitor comprising:
   a first metal containing electrode;
   an insulator disposed directly on the first metal containing electrode, the insulator including:
   a laminate structure in which two or more aluminum oxide ($Al_2O_3$) layers and two or more hafnium oxide ($HfO_2$) layers are laminated alternately in an iterative manner and a bottom layer and a top layer are formed of the same material, the two or more hafnium oxide ($HfO_2$) layers not crystallized, and the aluminum oxide ($Al_2O_3$) layers in the laminate structure each having the same thickness, the total thickness of the aluminum oxide ($Al_2O_3$) layers being smaller than the total thickness of the hafnium oxide ($HfO_2$) layers in the laminate structure; and
   a second metal containing electrode disposed directly on a surface of the insulator opposite from the first metal containing electrode,
   wherein an upper surface of the bottom layer of the laminate structure has a greater surface area than an upper surface of the top layer such that a portion of the bottom layer extends outside the top layer;
   an upper surface of at least one layer of the two or more aluminum oxide ($Al_2O_3$) layers and the two or more hafnium oxide ($HfO_2$) layers has a substantially equal surface area as the upper surface of the top layer; and
   an upper surface of at least one other layer of the two or more aluminum oxide ($Al_2O_3$) layers and the two or more hafnium oxide ($HfO_2$) layers has a substantially equal surface area as the upper surface of the bottom layer, such that a portion of the laminate structure disposed on the bottom layer outside the top layer has a thickness that is less than a portion of the laminate structure covered with the top layer.

16. The capacitor of claim 15, wherein the first metal containing electrode and the second metal containing electrode comprise one of a metal layer, a metal nitride layer, and a laminate layer thereof.

17. The capacitor of claim 16, wherein the metal layer comprises one of transition metal layers and the metal nitride layer comprises one of transition metal nitride layers.

18. The capacitor of claim 15, wherein the first metal containing electrode and the second metal containing electrode are formed of the same material.

19. The capacitor of claim 15, wherein the first metal containing electrode and the second metal containing electrode are formed of different materials.

20. The capacitor of claim 15, further comprising a second insulating layer formed on the second metal containing electrode, and an interconnection formed on the second metal containing electrode, a via being provided to electrically connect the second metal containing electrode to the interconnection.

21. The capacitor of claim 15, wherein the number of the alternate laminations of the aluminum oxide ($Al_2O_3$) layers and the hafnium oxide ($HfO_2$) layers is 9 or more and 1500 or less.

22. The insulator of claim 4, wherein the number of the alternate laminations of the aluminum oxide ($Al_2O_3$) layers and the hafnium oxide ($HfO_2$) layers is 9 or more.

23. The capacitor of claim 15, wherein the hafnium oxide ($HfO_2$) layers are each formed to a thickness of 40 Å or less.

24. The capacitor of claim 15, wherein at least one of the aluminum oxide ($Al_2O_3$) layers and at least one of the hafnium oxide ($HfO_2$) layers are doped with one of lanthanide elements.

25. A capacitor comprising:
a first metal containing electrode;
an insulator disposed directly on the first metal containing electrode, the insulator including:
a laminate structure in which two or more aluminum oxide ($Al_2O_3$) layers and two or more hafnium oxide ($HfO_2$) layers are laminated alternately in an iterative manner and a bottom layer and a top layer are formed of the same material, the hafnium oxide ($HfO_2$) layers each formed to a thickness of 40 Å or less, and the aluminum oxide ($Al_2O_3$) layers in the laminate structure each having the same thickness, the total thickness of the aluminum oxide ($Al_2O_3$) layers being smaller than the total thickness of the hafnium oxide ($HfO_2$) layers in the laminate structure; and
a second metal containing electrode disposed directly on a surface of the insulator opposite from the first metal containing electrode,
wherein an upper surface of the bottom layer of the laminate structure has a greater surface area than an upper surface of the top layer such that a portion of the bottom layer extends outside the top layer;
an upper surface of at least one layer of the two or more aluminum oxide ($Al_2O_3$) layers and the two or more hafnium oxide ($HfO_2$) layers has a substantially equal surface area as the upper surface of the top layer; and
an upper surface of at least one other layer of the two or more aluminum oxide ($Al_2O_3$) layers and the two or more hafnium oxide ($HfO_2$) layers has a substantially equal surface area as the upper surface of the bottom layer, such that a portion of the laminate structure disposed on the bottom layer outside the top layer has a thickness that is less than a portion of the laminate structure covered with the top layer.

26. The capacitor of claim 25, wherein at least one of the aluminum oxide ($Al_2O_3$) layers and at least one of the hafnium oxide ($HfO_2$) layers are doped with one of lanthanide elements.

27. The capacitor of claim 25, wherein the aluminum oxide ($Al_2O_3$) layers and the hafnium oxide ($HfO_2$) layers are deposited using a plasma enhanced atomic layer deposition (PEALD) process.

28. The capacitor of claim 25, wherein the number of the alternate laminations of the aluminum oxide ($Al_2O_3$) layers and the hafnium oxide ($HfO_2$) layers is 9 or more.

29. The capacitor of claim 15, further comprising a second insulating layer formed on the second metal containing electrode and a via filled with a conductive material provided in the second insulating layer,
wherein the two or more aluminum oxide ($Al_2O_3$) layers and the two or more hafnium oxide ($HfO_2$) layers in the laminate structure are laminated with parallel planar surfaces, and the via extends perpendicular to the parallel planar surfaces of the two or more aluminum oxide ($Al_2O_3$) layers and the two or more hafnium oxide ($HfO_2$) layers from the second metal containing electrode.

30. The capacitor of claim 15, wherein a portion of the insulator is disposed under the second metal containing electrode while a portion of the insulator extends laterally outside of the second metal containing electrode such that the portion of the insulator disposed under the second metal containing electrode has a greater thickness than the portion of the insulator disposed outside the second metal containing electrode.

31. The capacitor of claim 25, wherein a portion of the insulator is disposed under the second metal containing electrode while a portion of the insulator extends laterally outside of the second metal containing electrode such that the portion of the insulator disposed under the second metal containing electrode has a greater thickness than the portion of the insulator disposed outside the second metal containing electrode.

32. The capacitor of claim 30, wherein the portion of the insulator disposed outside the second metal containing electrode has a thickness that is equal to or less than approximately ½ of a thickness of the portion of the insulator disposed under the second metal containing electrode.

* * * * *